United States Patent
Chen et al.

(10) Patent No.: US 11,282,993 B2
(45) Date of Patent: Mar. 22, 2022

(54) DISPLAY DEVICE

(71) Applicant: InnoLux Corporation, Miao-Li County (TW)

(72) Inventors: Chia-Lun Chen, Miao-Li County (TW); Shih-Chang Huang, Miao-Li County (TW); Ming-Hui Chu, Miao-Li County (TW); Chih-Chang Chen, Miao-Li County (TW); Kai-Hsien Hsiung, Miao-Li County (TW); Hui-Chi Wang, Miao-Li County (TW); Wun-Yuan Su, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/931,830

(22) Filed: May 14, 2020

(65) Prior Publication Data
US 2020/0395516 A1    Dec. 17, 2020

(30) Foreign Application Priority Data
Jun. 14, 2019   (CN) .......................... 201910517111.2

(51) Int. Cl.
| H01L 33/58 | (2010.01) |
| H01L 25/075 | (2006.01) |
| H01L 33/60 | (2010.01) |
| H01L 33/50 | (2010.01) |

(52) U.S. Cl.
CPC .......... *H01L 33/58* (2013.01); *H01L 25/0753* (2013.01); *H01L 33/505* (2013.01); *H01L 33/60* (2013.01)

(58) Field of Classification Search
None
See application file for complete search history.

(56) References Cited

U.S. PATENT DOCUMENTS

| 2011/0002140 | A1* | 1/2011 | Tsukahara | ............. B32B 27/286 |
| | | | | 362/602 |
| 2016/0097495 | A1* | 4/2016 | Yamamoto | ........... G02B 6/0073 |
| | | | | 349/65 |
| 2021/0141272 | A1* | 5/2021 | Boyd | ................ G02F 1/133606 |
| 2021/0296543 | A1* | 9/2021 | Aoyama | ................ H01L 27/32 |

* cited by examiner

*Primary Examiner* — Bo B Jang
(74) *Attorney, Agent, or Firm* — McClure, Qualey & Rodack, LLP

(57) ABSTRACT

A display device is provided, including a display panel; a light-emitting element disposed under the display panel; an optical functional film disposed between the display panel and the light-emitting element. The optical functional film is capable of transmitting at least part of the light emitted from the light-emitting element. A diffuser film is disposed between the display panel and the light-emitting element. The haze of the diffuser film is greater than 85%, and the thickness of the diffuser film ranges from 0.1 mm to 0.3 mm.

20 Claims, 5 Drawing Sheets

DISPLAY DEVICE

CROSS REFERENCE TO RELATED APPLICATIONS

This application claims priority of provisional application of China Patent Application No. 201910517111.2 filed on Jun. 14, 2019, the entirety of which is incorporated by reference herein.

BACKGROUND

Technical Field

The present disclosure relates to a display device, specifically to a display device with a back light source.

Description of the Related Art

Display devices have become indispensable for current electronic devices to deliver information to users, and for users to conduct intuitive interactions with their electronic devices.

However, as technology develops, consumers are demanding more from display devices. For example, they are expecting the display devices to have a broader color region, color that is more vivid, and higher dynamic contrast, so the image can be more detailed. Thus, current display devices still have need for improvement.

SUMMARY

The present disclosure provides a display device, comprising a display panel; a light-emitting element disposed under the display panel; an optical functional film disposed between the display panel and the light-emitting element, wherein the optical functional film is capable of transmitting at least part of the light emitted from the light-emitting element; and a diffuser film disposed between the display panel and the light-emitting element. The haze of the diffuser film is greater than 85%, and the thickness of the diffuser film ranges from 0.1 mm to 0.3 mm.

To more clearly understand the present disclosure as described and other purposes, features and advantages, some embodiments of the disclosure will be described in detail with the accompanying drawings.

DETAILED DESCRIPTION

Figure 1:
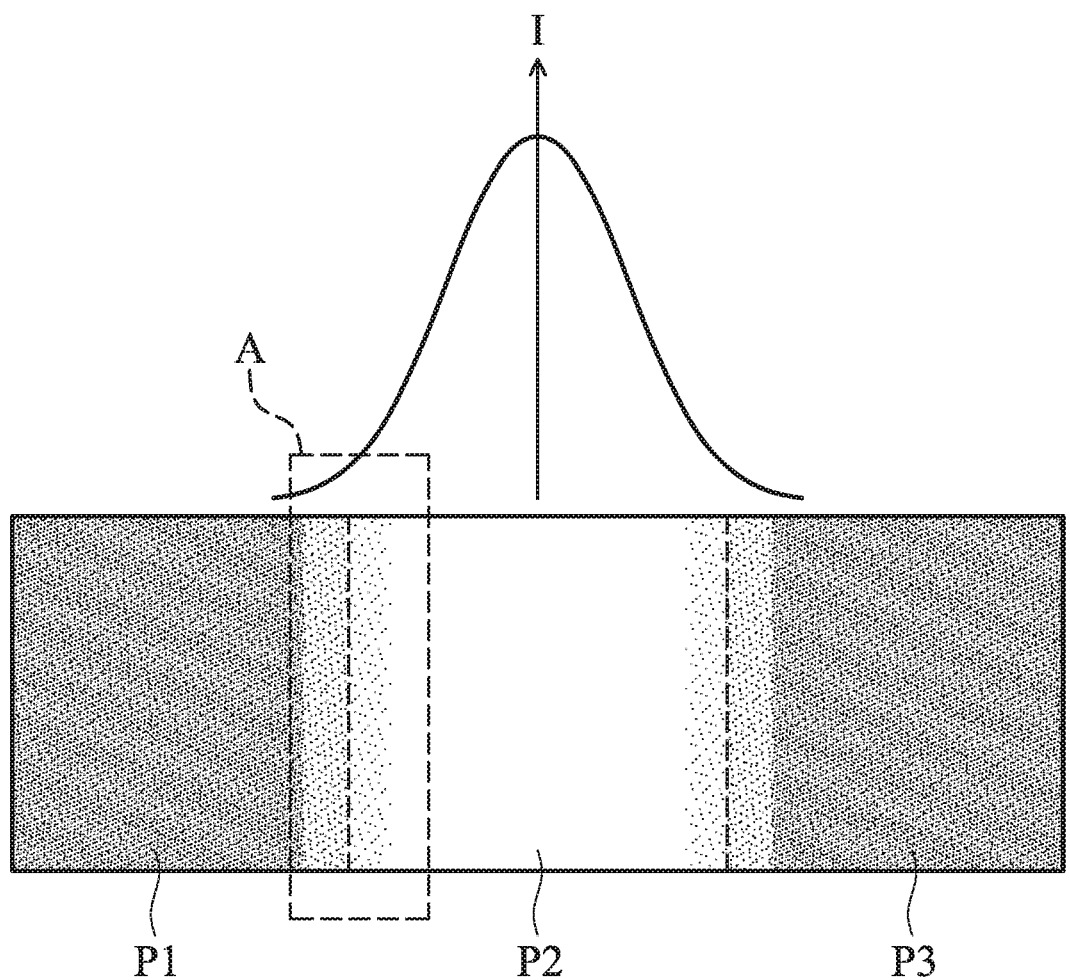
FIG. 1 is illustrates the cause of low dynamic contrast of a display image of a display device.

The following will explain in detail a display device provided by the present disclosure. It should be understood that the following disclosure provides many different embodiments or examples, for implementing different features of the present disclosure. The specific features and their positions are described as followed, to simplify the specification of the embodiment of the disclosure. These are, of course, merely examples and are not intended to be limiting. In addition, the disclosure may repeat reference numerals and/or letters in various embodiments, to more clearly describe the present disclosure. However, this repetition is for the purpose of simplicity and clarity, and does not in itself dictate a relationship between the various embodiments discussed.

It should be understood that elements or devices in the figures may exist in various forms known by those skilled in the art. Furthermore, spatially relative terms, such as "underlying," "below," "lower," "overlying," "upper", "upper", and the like, may be used herein for ease of description to describe one element or feature's relationship to another element(s) or feature(s) as illustrated in the figures. It should be understood that if the apparatus were otherwise oriented (rotated 90 degrees or at other orientations), then the spatially relative descriptors used herein may likewise be interpreted accordingly, for example, the "lower" side of the device will become the "higher" side after orientation. The present disclosure may be comprehended with accompanying figures, in which the figures are also considered as part of the present disclosure. It should be understood that various features are not drawn to scale. In fact, the dimensions of the various features may be arbitrarily increased or reduced for clarity of discussion.

The terms "about", "approximately", "substantially", and "essentially" used herein generally refer to the value of an error or a range within 5%, preferably within 3%, and more preferably within 1%, or 2%, or within 1%, or 0.5%. The given values are approximate values. If there is no specific description on "about", "approximately", "substantially", or "essentially", the values mentioned are still to be regarded as an error or range expressed as "about", "approximate", "substantially", or "essentially".

In some embodiments of the present disclosure, terms that describe a joining or connecting action, such as "connect", "interconnect", or the like, unless otherwise defined, may include embodiments in which two features are formed in direct contact, and they may also include embodiments in which additional features may be formed between the two features. Furthermore, it should be understood that related terms, such as "over . . . " or the like, described in the present disclosure may include embodiments being in direct contact with the subject to be covered, and they may also include embodiments in which additional features on the subject before the subject is being covered, so the subject and the additional features may partially overlap when viewed from above, so the coverage is not in direct contact.

Since non-self-luminous display devices have display elements (such as liquid-crystal display panel) that does not illuminate itself, and thus, displaying images requires additional back light source to provide the necessary lighting during display. For example, light-emitting diode may be applied as the light-emitting element of the display device light source, and the structure applied can be distinguished into direct back light source directly arranged behind the display panel, and edge-lit back light source arranged around the panel's perimeter. When applying the structure of direct back light source, besides the advantages of high light output efficiency, no need of light guide plate, and fewer spare parts, local dimming on smaller area may also be performed.

The so-called local dimming changes the brightness of the display region locally by controlling the brightness of individual light source based on the image data of the display device shown. For example, dynamic contrast of the image can be increased by having low brightness (even no brightness) at image dark region, and having high brightness at image bright region.

However, in display device, when light is emitted from light-emitting element, besides transmitting part of the emitting light through the display panel above, other parts of the emitting light are reflected by the display panel, or some films under the display panel, back to the bottom of the display device (such as a substrate). Since the bottom of the display device will reflect the reflected light again, the actual illumination status above a single light-emitting element, other than the central part desired to be illuminating originally, may generate photoflood at the outer edge. In other words, when observing the display device, a halo may occur surrounding a single light-emitting element.

The edge photoflood (halo) may make it impossible to precisely control the bright region and the dark region, leading to deteriorating dynamic contrast of the image. For example, refer to FIG. 1, a region P1, a region P2, and a region P3 are adjacent regions. When the region P1 and the region P3 are desired to be no brightness or low brightness (such as black), and the middle region P2 is desired to be high brightness (such as white), the corresponding light-emitting element below the region P2 may be lit, while the corresponding light-emitting elements below the region P1 and the region P3 may be turned off, to perform local dimming. However, when the photoflood is occurred at the light-emitting element corresponding to the region P2 below, a light-emitting intensity I of the region P2 will be as shown by the plot in FIG. 1, reducing from the center to the edge. However, due to the aforementioned photoflood, light of the region P2 may be partially extended to the supposedly dark region of the region P1. Therefore, the borders of region A between the region P1 and the region P2 cannot be clearly distinguished, resulting in blurry borders. In this case, the bright region and the dark region cannot be clearly distinguished, so dynamic contrast of the image may not be effectively elevated. In one embodiment, the dynamic contrast can be obtained by measuring the ratio value of the brightness on geometric center of the region P2 (bright region) to the brightness on geometric center of the region P1 or the region P3 (dark region), or by measuring the ratio value of overall brightness of the region P2 to overall brightness of the region P1 or the region P3. In another embodiment, the appearances of the region P1, the region P2, and the region P3 may be essentially the same or different, while the shape of the region P1, and/or the region P2, and/or the region P3 in FIG. 1 is not limited to square, where the shape can also be rectangular, circular, or any other applicable shapes, and the present disclosure is not limited hereto. In one embodiment, the display device may include a plurality of regions (such as P1, P2, and P3 in FIG. 1 and/or other regions), and thus one of the regions may also include a plurality of light-emitting elements 103. The plurality of light-emitting elements 103 may emit light of the same color, or light of a different color, but the present disclosure is not limited hereto.

Figure 2:
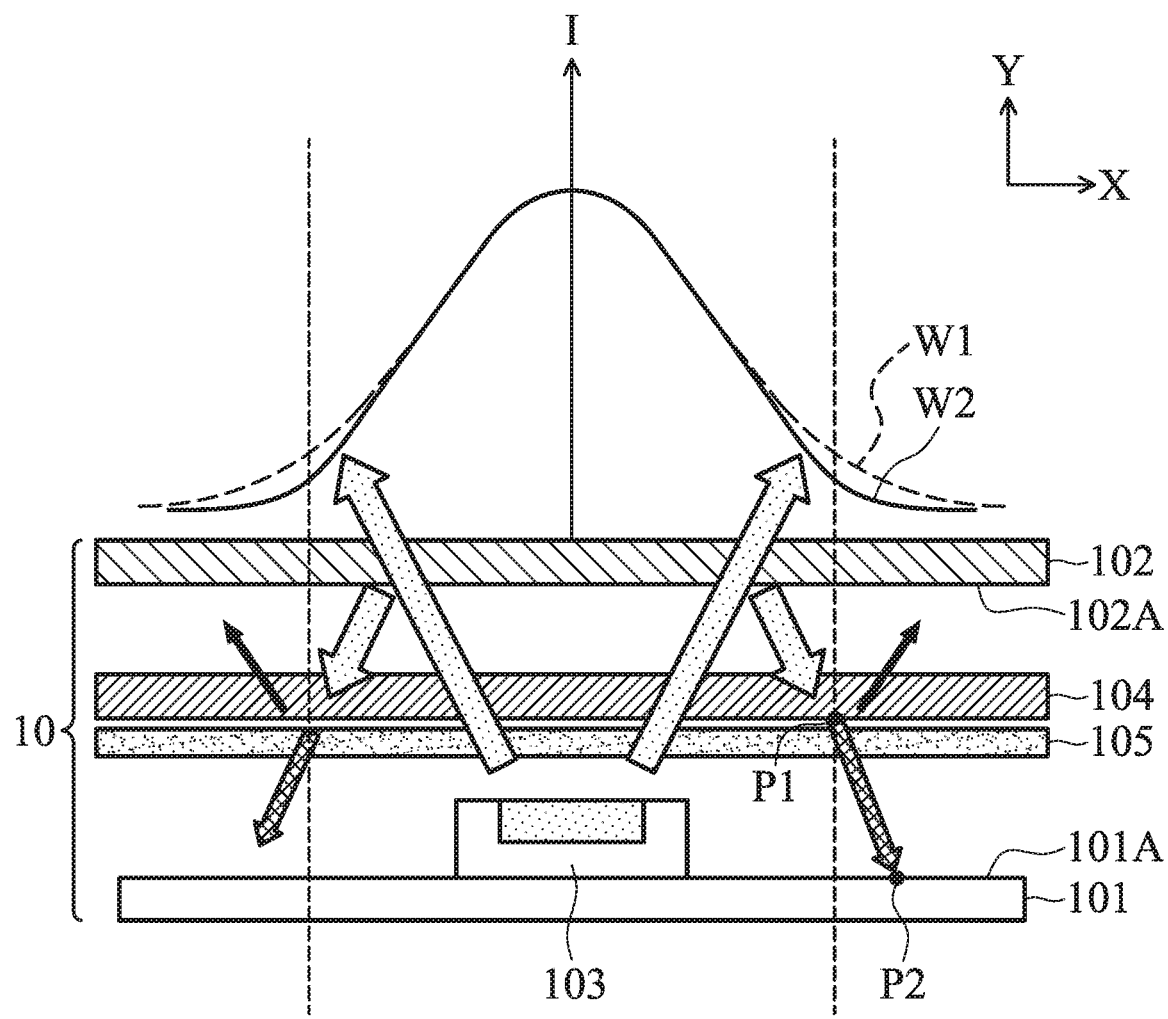
FIG. 2 illustrates a cross-sectional view of a display device, with schematic explanation of the principles, according to some embodiments of the present disclosure.

Refer to FIG. 2. According to some embodiments, the present disclosure provides a display device 10, the display device 10 includes a display panel 102 and a light-emitting element 103 disposed under the display panel 102, an optical functional film 104 disposed between the display panel 102 and the light-emitting element 103, and a diffuser film 105 disposed between the display panel 102 and the light-emitting element 103. To be more precisely, the diffuser film 105 may be disposed between the optical functional film 104 and the light-emitting element 103. When the light-emitting element 103 emits light, besides transmitting part of the emitting light through the display panel 102, another parts of the emitting light may be reflected by the display panel 102, or reflected by a bottom surface 102A of the display panel 102, back to the bottom of the display device 10, such as a top surface 101A of the substrate 101 or the region between the diffuser film 105 and the substrate 101. In one embodiment, when the optical function film 104 is present, since the optical function film 104 may partially transmit part of the light reflecting back toward the bottom of the display device 10 (such as top surface 101A of the substrate 101), or transmit toward at least one side of the light-emitting element 103, while another part of the reflected light may reflect again. Therefore, part of the reflected light may reflect again before reaching the bottom of the display device 10. In the x-direction, a reflection point, such as a reflection point P1, is closer to the light-emitting element 103 than a reflection point, such as a reflection point P2, at the bottom of the display device 10. In the y-direction, the reflection point P1 is closer to the bottom surface 102A of the display panel 102 than the reflection point P2, and thus a halo size may be reduced. That is, disposing the optical function film 104 between the display panel 102 and the light-emitting element 103 may reduce the halo effect of the display device 10. Furthermore, the reflecting light back toward the substrate 101 may be reduced, thereby the light to be reflected again by the top surface 101A of the substrate 101 may be reduced, so that the purpose of reducing the edge photoflood surrounding the light-emitting element 103 and reducing the halo size may be achieved. Additionally, since the diffuser film 105 is disposed between the display panel 102 and the light-emitting element 103, the display device 10 may generated substantially uniform light, and the viewing experience may be improved.

Refer to FIG. 2, in the upper part of FIG. 2, a wave W1 is the distribution of the light intensity I before using the optical functional film 104 and the diffuser film 105, and a wave W2 is the distribution of the light intensity I after using the optical functional film 104 and the diffuser film 105. By using the optical functional film 104 and the diffuser film 105, since the light to be reflected back toward the substrate 101 is affected by the optical functional film 104, a portion of the light may penetrate the optical functional film 104, and therefore the outer edge light to be reflected by the top surface 101A of the substrate 101 is reduced, so the distribution of the light intensity I above the light-emitting element 103 may be changed from the wave W1 to the wave W2, which means the photoflood beyond the region desired to be lit may be further reduced.

The diffuser film 105 described by the present disclosure may be a film that may include the effect of diffusing an incident light. In some embodiments, the diffuser film 105 may be a resin film having diffusing particles distributing in a base material, so the light may be transmitted through mediums with different refractivity, to generate refraction, reflection, or diffusion phenomena, and the light may be uniformly diffused. In some embodiments, the diffusing particles may be organic polymers or inorganic materials, such as polymethyl methacrylate (PMMA), silicon dioxide (SiO$_2$), silicone, or the like, or the combinations thereof, but the present disclosure is not limited hereto. The materials of the resin film may be polycarbonate (PC), polystyrene, polyester, polyolefin, polyether, polyether-ester, polymethacrylate, or polyperfluorinated ethylene propylene (PEP), or the like, or the combinations thereof, but the present disclosure is not limited hereto.

In some embodiments, the haze of the diffuser film 105 may be approximately greater than 85%; the thickness of the diffuser film 105 may range approximately between 0.04 mm and 0.35 mm. By maintaining the haze and the thickness of the diffuser film 105 within a certain range, the overall thickness of the display device 10 may be reduced, while the display device 10 may still have a certain light source uniformity. Additionally, in some embodiments, a distance between the diffuser film 105 and the light-emitting element 103 may be a range approximately between 0 mm and 10 mm to obtain substantial uniformity of the preferred light source. In some embodiments, the distance described may be the shortest distance between the bottom surface of the diffuser film 105 and the light-emitting element 103.

The haze described in the present disclosure may be measured using a haze meter (NDH-5000SP). The haze may be measured by the following method. After a light ray is transmitted through a measurement target, it will be input to an integration ball. In this procedure, light is separated by the measurement target into diffused light transmittance (DT) and parallel light transmittance (PT), which are reflected into the integration ball, followed by being collected by a light receptor device. The haze may be obtained by measuring collected light rays. The haze is defined as the percentage of the diffused light transmittance to a total light transmittance (haze (%)=100×DT/TT), wherein the total light transmittance (TT) is a sum of the diffused light transmittance (DT) and the parallel light transmittance (PT).

The substrate 101 of the present disclosure may be any suitable, rigid or flexible substrate capable of carrying the light-emitting element 103. The materials may include, for example, glass, ceramic (such as silicon nitride or aluminum nitride), sapphire, plastic (such as fiberglass-reinforced plastics (FRP), polyester film, polyethylene terephthalate (PET), polyethylene naphthalate (PEN), or polyethersulfone (PES) or acrylic resin film) or any other suitable materials for substrates.

The light-emitting element 103 described in the present disclosure may be any suitable light-emitting device. For example, light-emitting device may include an electroluminescence (EL) device (such as organic electroluminescence device or inorganic electroluminescence device), an organic light-emitting diode (OLED), an inorganic light-emitting diode (LED) (such as micro light-emitting diode, mini light-emitting diode, quantum dot light-emitting diode (QLED)), a laser diode (LD), or the like, but the present disclosure is not limited hereto.

The display panel 102 described in the present disclosure may be any suitable non-self-luminous display panel, for example, it may be a liquid-crystal display panel of twisted nematic (TN) mode, in-plane switching (IPS) mode, fringe field switching (FFS) mode, multi-quadrant vertical alignment (MVA) mode, patterned vertical alignment (PVA) mode, axisymmetric aligned microcell (ASM) mode, optically compensated birefringence (OCB) mode, or the like, but the present disclosure is not limited hereto.

Figure 3:
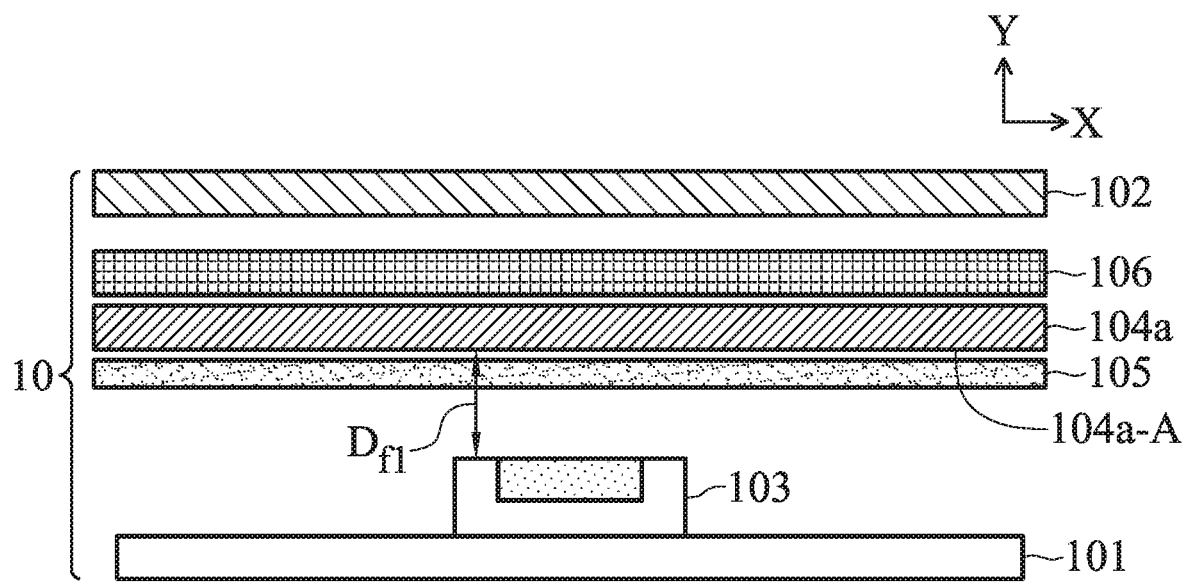
FIGS. 3 and 4 illustrate cross-sectional views of display devices, according to some embodiments of the present disclosure.

Next, refer to FIG. 3, which illustrates a cross-sectional view of a display device 10, according to some embodiments of the present disclosure. In some embodiments, the light-emitting element 103 may emit blue light, or the light-emitting element 103 may emit a wavelength approximately between 440 nm and 470 nm, or approximately between 440 nm and 550 nm, and the optical functional film 104 may be a blue light transmittance film 104a. Inside the display device 10 (for example, between the display panel 102 and the substrate 101), it may further include a wavelength transformation layer 106 disposed on the optical function film 104 (or the blue light transmittance film 104a in this embodiment) on the side farthest away from the light-emitting element 103. In some embodiments, any wavelength in the blue light waveband emitted from the light-emitting element 103 may be transmitted through the blue light transmittance film 104a, but individual transmittances of the aforementioned wavelengths to the blue light transmittance film 104a may be approximately the same or different. It should be noted that when the light intensity of the aforementioned wavelengths are too weak, the light intensity transmitting through the blue light transmittance film 104a may be too low to be measured by a spectrometer. The spectrometer described herein may be, for example, a CS-2000 or a CS-2000A spectrometer, however, these are merely examples, and are not intended to be limiting.

Refer to FIG. 3. In some embodiments, by choosing a suitable optical functional film 104 to work with a light wavelength emitted from the light-emitting element 103, the light-emitting element 103 may generate light transmittance, while reflecting light of other wavebands. In other words, as shown in the embodiment of FIG. 3, when the light-emitting element 103 may emit blue light, and after the wavelength transformation layer 106 receiving such blue light, the wavelength transformation layer 106 will transform this blue light into multi-color light of other colors (such as white). In this case, the optical functional film 104 may be a blue light transmittance film 104a. In this embodiment, the blue light emitted from the light-emitting element 103 may transmit through the blue light transmittance film 104a to reach the wavelength transformation layer 106, and after passing through the wavelength transformation layer 106, the emitted blue light will be transformed into white light. Such white light, after being reflected by, for example, the display panel 102, may redirect toward the light-emitting element 103, and may reenter the blue light transmittance film 104a. Since the blue light transmittance film 104a may transmit blue light, while reflecting light of other wavebands, therefore only the blue light part of the white light entering the blue light transmittance film 104a may transmit through the blue light transmittance film 104a to reach the substrate 101. Other colors of lights within other parts of the white light will be reflected, and unable to reach the substrate 101. Therefore, other light colors of the white light (for example, red light, green light, or red light and green light) may be reflected by the blue light transmittance film 104a, before reaching the substrate 101. Since the reflection point is closer to the display panel 102, a smaller halo with a color close to yellow (or less obvious than white light) may be generated. Furthermore, the light reaching the substrate 101 may be reduced, thereby reducing the light to be reflected again by the substrate 101, which generates the effect of reducing the halo size of the light-emitting element 103.

Similarly, in some embodiments, if the light-emitting element 103 emitted blue and red light, then the optical function film 104 may be blue light and red light transmittance film, and the wavelength transformation layer 106 may be a layer that transforms blue light or red light into white light. Blue light and red light transmittance film may allow blue light and red light, which is directed toward the light-emitting element 103 after reflecting, to transmit, while reflecting light in other wavebands, in order to reduce the light reaching the substrate 101, thereby achieving the effect of reducing the halo size.

Materials of the blue light transmittance film 104a described in the present disclosure are not specifically limited, as long as they are suitable materials (which the film is made of) that allow the desired blue light wavelength to transmit. For example, they may be polyethylene naphthalate (PEN), polycarbonate (PC), polyethylene terephthalate (PET), or the like, but the present disclosure is not limited hereto. The blue light transmittance film 104a may be a stack of multiple layers, but it may also be a single layer. In some embodiments, the blue light transmittance film 104a may have at least, or in average, approximately greater than 50% transmittance at wavelengths within an approximate range of 380 nm to 550 nm, or 440 nm to 550 nm. In some embodiments, in a visible region outside wavelengths of an approximate range of 550 nm to 700 nm, the blue light transmittance film 104a may have at least, or in average, approximately greater than 90% reflectivity, or greater than 95% reflectivity. The reflectivity described in the present disclosure may be measured by any suitable equipment, for example, may be measured by High-Performance Desktop Colorimeter (model: ColorQuest XE, light source spectrum range: 400 nm-700 nm), but the present disclosure is not limited hereto.

Refer to FIG. 3. The locations of layers within the display device are not specifically limited, as long as the wavelength transformation layer 106 is disposed on the side of the blue light transmittance film 104a that is farthest away from the light-emitting element 103. In some embodiments, in order for the blue light passing through the blue light transmittance film 104a to be transformed more effectively, the wavelength transformation layer 106 and the blue light transmittance film 104a may directly contact each other, or there are no other layers between the wavelength transformation layer 106 and the blue light transmittance film 104a. In addition, in some embodiments, the diffuser film 105 may be disposed between the blue light transmittance film 104a and the light-emitting element 103, compared to disposing the diffuser film 105 between the blue light transmittance film 104a and the wavelength transformation layer 106, since the light emitted from the light-emitting element 103 may be collimated before passing through the blue light transmittance film 104a, the display device overall may have more excellent brightness. The thickness of the blue light transmittance film 104a is also not specifically limited. In some embodiments, in consideration of support strength, the thickness of the blue light transmittance film 104a is within an approximate range of 0.03 mm to 0.50 mm. In some embodiments, for increasing the effect and completeness of reflection, the optical functional film 104 (for example, the blue light transmittance film 104a of FIG. 3) may be a continuous film: That is, a layer covering almost the entire display panel 102. In some embodiments, there may be a distance $D_{f1}$ between the blue light transmittance film 104a and the light-emitting element 103, and the distance $D_{f1}$ may be a range between 0 mm and 10 mm. In some embodiments, the distance $D_{f1}$ described above may be the shortest distance between the bottom surface 104a-A of the blue light transmittance film 104a and the light-emitting element 103.

The wavelength transformation layer 106 described in the present disclosure, in order to have layers of wavelength transformation materials, may transform wavelength of the received light into light with different wavelength, which is then emitted. For example, after the wavelength transformation layer 106 receives blue light, white light is then emitted. The wavelength transformation layer 106 is not specifically limited. For example, it may be quantum dot film (QDF) or phosphor film, such as resin films includes quantum dot materials or includes phosphor powder materials. The resin described may be transparent resin, for example, epoxy resin, polyimide resin, acrylic resin, silicone resin, or the combinations thereof, but the present disclosure is not limited hereto. By selecting suitable inorganic photoluminescence materials, organic photoluminescence materials, or quantum dot materials, after the wavelength transformation layer 106 receives light emitted from the light-emitting element 103, may transform into multi-color light (which may still have the light waveband emitted from the light-emitting element 103, or may not have the light waveband emitted from the light-emitting element 103) comprising other colors (different wavelength).

For example, quantum dot materials may be binary mixtures, ternary mixtures, or quaternary mixtures of II-VI group, III-V group, IV-VI group, or IV group. For example, quantum dot materials of binary mixtures may be CdS, CdSe, CdTe, ZnS, ZnSe, ZnTe, HgS, HgSe, HgTe (II-VI group), AN, AlP, AlAs, AlSb, GaN, GaP, GaAs, GaSb, InN, InP, InAs, InSb (III-V group), PbS, PbSe, PbTe, SnS, SnSe, SnTe (IV-VI group), SiC, SiGe (IV group), or the like, or the combinations thereof. For example, quantum dot materials of ternary mixtures may be CdSeS, CdSeTe, CdSTe, ZnSeS, ZnTeSe, ZnSeTe, ZnSTe, CdZnS, CdZnSe, CdZnTe (II-VI group), GaNP, GaNAs, GaNSb, GaPAs, GaPSb, AlNP, AlNAs, AlNSb, AlPAs, AlPSb (III-V group), or the like, or the combinations thereof. For example, quantum dot materials of quaternary mixtures may be CdZnSeS, CdZnSeTe, HgZnTeS (II-VI group), GaAlNAs, GaAlNSb, GaInNP, InAlNP (III-V group), SnPbSSe, SnPbSeTe, SnPbSTe (IV-VI group), or the like, or the combinations thereof. Quantum dot materials may also be selected from IV group materials, such as Si, Ge, or the combinations thereof.

For example, phosphor powder materials may be $Y_3Al_5O_{12}$, $Gd_3Ga_5O_{12}$:Ce, (Lu, Y)$_3$Al$_5$O$_{12}$:Ce, SrS:Eu, SrGa$_2$S$_4$:Eu, (Sr, Ca, Ba)(Al, Ga)$_2$S$_4$:Eu, (Ca, Sr)S:(Eu, Mn), (Ca, Sr)S:Ce, (Sr, Ba, Ca)$_2$Si$_5$N$_8$:Eu, (Sr, Ba, Ca)(Al, Ga)SiN$_3$:Eu, (Ba, Sr, Ca)$_2$SiO$_4$:Eu, (Ca, Sr, Ba)SW$_2$O$_2$N$_2$:Eu, or CdZnSe, but the present disclosure is not limited hereto.

Figure 4:
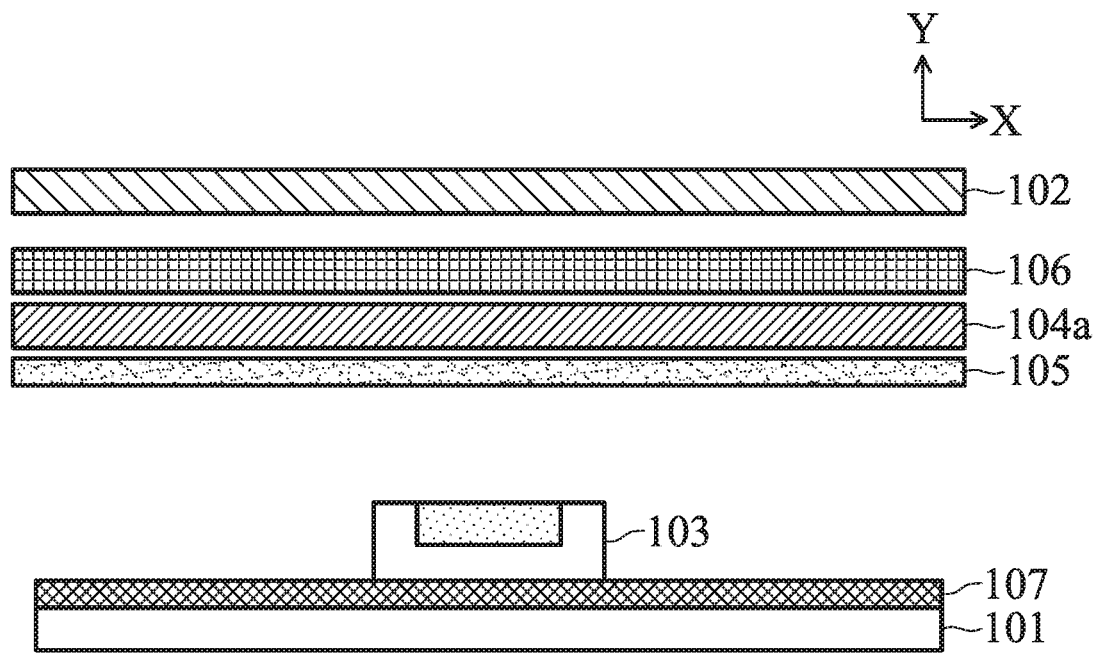

Next, refer to FIG. 4. In some embodiments, there may be a reflective layer 107 disposed between the light-emitting element 103 and the substrate 101. The materials of the reflective layer 107 are not specifically limited, as long as they are layers that can reflect light. In some embodiments, the reflective layer 107 may be a white ink with a thickness in an approximate range of 0.05 mm to 0.35 mm, or a metal-containing layer with a thickness in an approximate range of 0.05 mm to 0.35 mm. In some embodiments, the reflective layer 107 may be a continuous layer, and may approximately cover an upper surface of the substrate 101 to increase the light source usage from the light-emitting element 103. Yet in some embodiments, a reflectivity of the reflective layer 107 may be approximately greater than 95%, when the reflectivity of the reflective layer 107 is between 80% and 95%, or approximately greater than 80%, the halo size may all be reduced. In some embodiments, by coating, for example, photoresist of a specific color or using a white resin with a specific coating/screen printing on the surface of the reflective layer 107 away from the substrate 101, the reflective layer 107 cooperates with the optical functional film 104 to reflect the optical light that can be transmitted by the optical functional film 104. For example, when the optical functional film 104 is the blue light transmittance film 104a, the reflective layer 107 may be the reflective layer 107 reflecting the blue light waveband, and may further reduce the light to be reflected again through the reflective layer 107.

Figure 5:
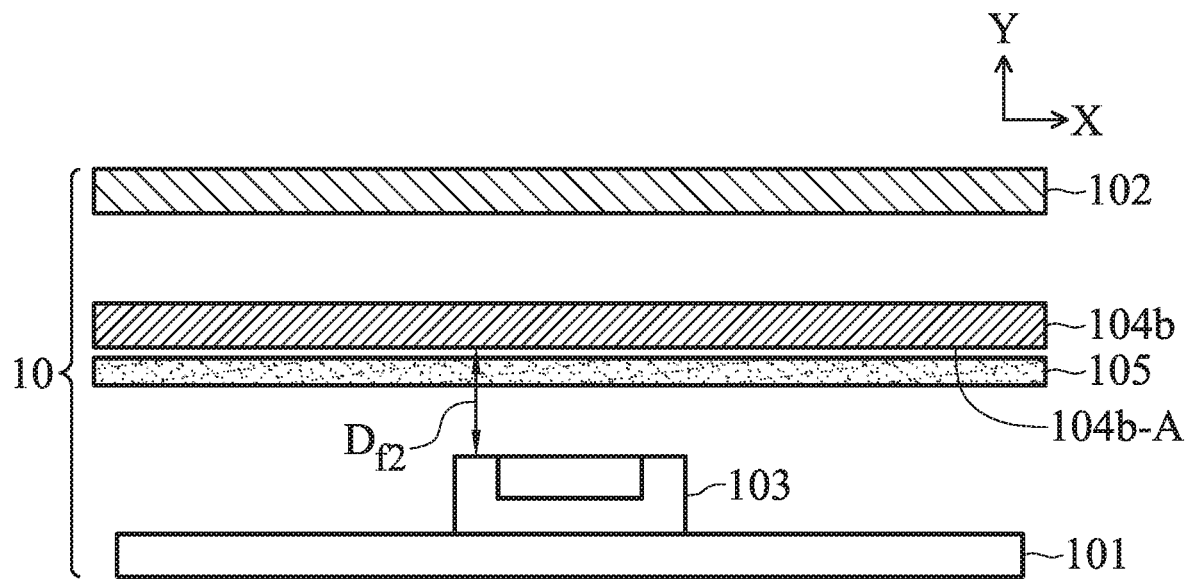
FIGS. 5 and 6 illustrate cross-sectional views of display devices, according to other embodiments of the present disclosure.

Refer to FIG. 5, which illustrates a cross-sectional view of a display device 10, according to other embodiments of the present disclosure. In some embodiments, the light-emitting elements 103 may also be a light-emitting element that emits white light. In this case, as previously described, a transflective film 104b, as the optical functional film 104, may be used to cooperate with the light waveband emitted from the light-emitting element 103. In some embodiments, the transflective film 104b may partially transmit and partially reflect all visible light waveband. Therefore, when the light-emitting element 103 emits white light, the transflective film 104b disposed above the light-emitting element 103 may similarly reflect part of the light toward the side of the light-emitting element 103 before arriving the substrate 101, and therefore, part of the light may be reflected before reaching the substrate 101, to reduce the amount of light reaching the substrate 101, thereby reducing the size of the halo generated by the light-emitting element 103.

In some embodiments, the transflective film 104b may reflect and transmit the entry light, and the transflective film 104b may not alter a polarization condition of the entry light. The thickness and materials of the transflective 104b are not specifically limited, as long as a visible light waveband may partially transmit and partially reflect. In some embodiments, the transflective film 104b may be metal-containing layer with a thickness in an approximate range of 0.03 mm to 0.40 mm. For example, it may be the transflective film 104b of Ag-containing alloy. In some embodiments, the transflective film 104b may be a single layer or a multiple-layer structure. In some embodiments, a minimum reflectivity of the transflective film 104b, at wavelengths within a range of 380 nm and 700 nm, is approximately greater than 50%.

Furthermore, even though in the embodiment shown in FIG. 5, the diffuser film 105 is disposed between the transflective film 104b and the light-emitting element 103, in some embodiments, the transflective film 104b may also be disposed between the diffuser film 105 and the light-emitting element 103. In some embodiments, there may be a distance $D_{f2}$ between the transflective film 104b and the light-emitting element 103, the distance $D_{f2}$ may be between 0.1 mm and 10.0 mm. In some embodiments, the distance $D_{f2}$ described may be the shortest distance between a bottom surface 104b-A of the transflective film 104b and the light-emitting element 103.

Figure 6:
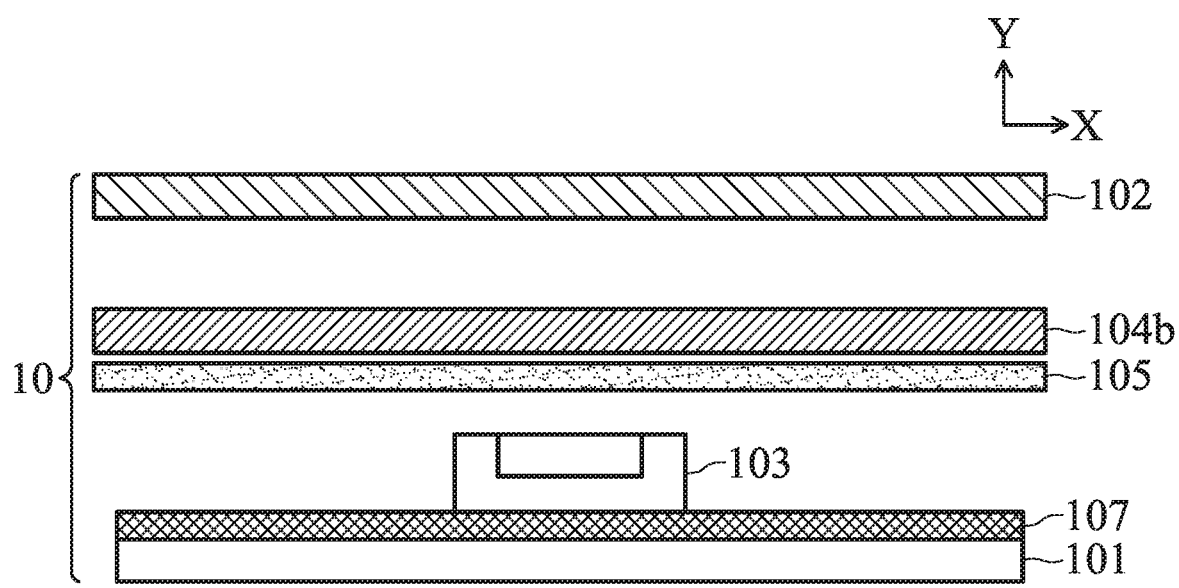

Also, refer to FIG. 6. In some embodiments, as previously described, when the optical functional film 104 is the transflective film 104b, the display device 10 may further include the reflective layer 107 disposed between the light-emitting element 103 and the substrate 101. The reflective layer 107 used herein may be the same as the aforementioned reflective layer 107, thus it is not repeated herein. In some embodiments, a reflective index of the reflective layer 107 may range from 0.80 to 0.95.

Figure 7:
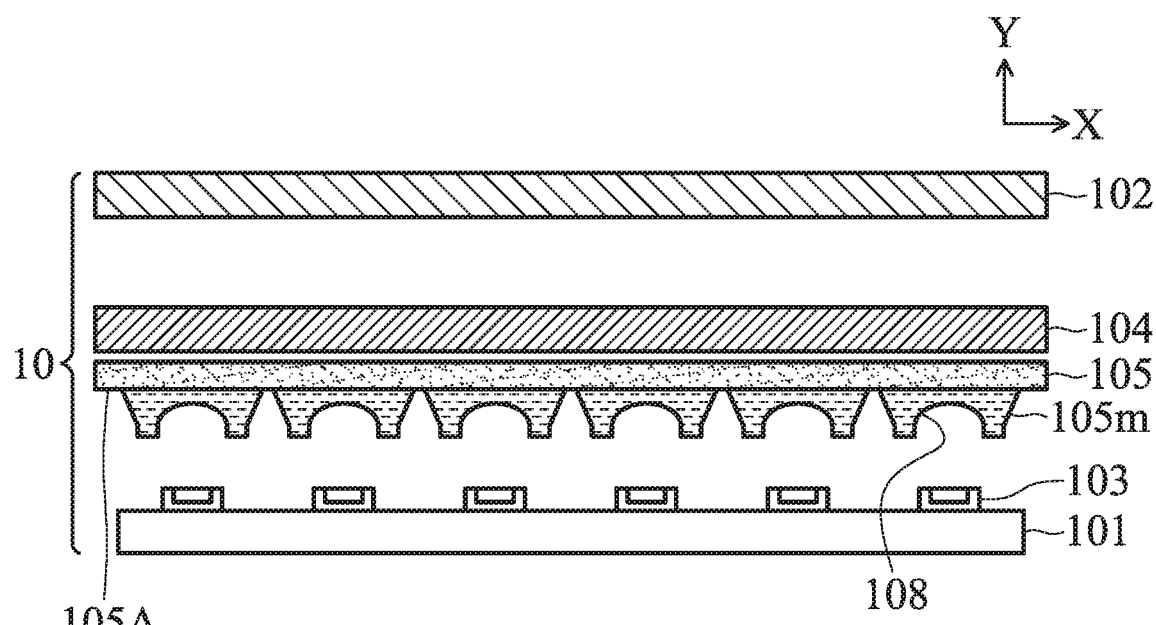
FIG. 7 illustrates a cross-sectional view of a display device, according to some embodiments of the present disclosure.
Figure 8:
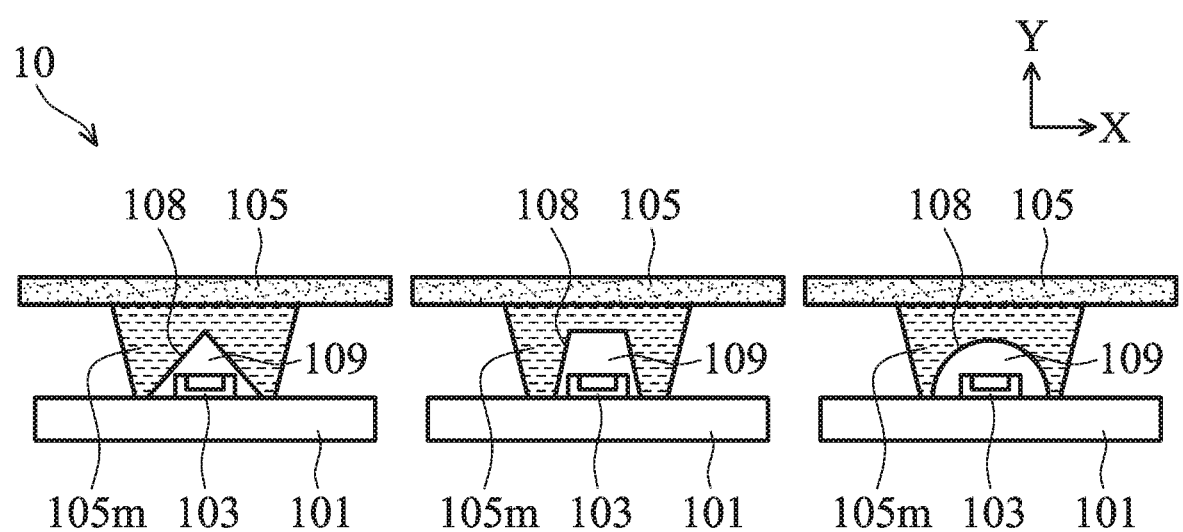
FIG. 8 illustrates cross-sectional views of individual micro-structures, according to some embodiments of the present disclosure.

Next, refer to FIG. 7. FIG. 7 illustrates a cross-sectional view of a display device 10, according to some embodiments of the present disclosure. In some embodiments, when the diffuser film 105 of the display device 10 is disposed between the optical functional film 104 and the light-emitting elements 103, the diffuser film 105 may have micro-structures 105m on a side of the diffuser film 105 that may be near the light-emitting elements 103, for example, a surface 105A of the diffuser film 105. The micro-structures 105m may have recesses 108, and the recesses 180 may be directed toward the light-emitting elements 103, respectively (for example, recesses 108 may be disposed along negative Y-direction). Refer to FIG. 8, the recesses 108 may contact, for example, the substrate 101 or the reflective layer (not show) which may be disposed between the light-emitting elements 103 and the substrate 101, so cavities 109 may be formed between the recesses 108 and the substrate 101 or the reflective layer. In some embodiments, the cavities 109 may accommodate one or more light-emitting elements 103. The light output condition of the light-emitting elements 103, which may be accommodated by the micro-structures 105m, may be further controlled, to change the halo size of the light-emitting elements 103, thereby modifying the visual effect of the display device 10.

In some embodiments, a haze of the micro-structures 105m and the haze of the diffuser film 105 may be different. For example, the haze of the micro-structures 105m may be greater than, or less than the haze of the diffuser film 105. The transmittance of the micro-structures 105m and the transmittance of the diffuser film 105 in the same waveband may also be different. For example, the transmittance of the micro-structures 105m may be greater than, or less than the transmittance of the diffuser film 105.

The micro-structures 105m and the diffuser film 105 may include the same materials, but they may also use different materials. The materials used by micro-structures 105m are also not specifically limited. In one embodiment, the materials of the micro-structures 105m may be polymers, such as ultra violet acrylic resin, polymethyl methacrylate, polycarbonate, silica gel, polyethylene terephthalate (PET), or the like, or may also be the combinations thereof, but the present disclosure is not limited hereto. When the micro-structures 105m and the diffuser film 105 use the same materials, the micro-structures 105m and the diffuser film 105 may also be formed in the same process. For example, in some embodiments, the diffuser film 105 and the micro-structures 105m may be simultaneously formed by the desired shape mold of the micro-structures 105m, through injection molding and knockout methods.

Refer to FIG. 8, in some embodiments, the cross-sections of the recesses 108 of the micro-structures 105m (or the shape of the cavities 109 formed between the recesses 108 and the substrate 101 or the reflective layer) may be a triangle, an arch, a trapezoid, or the like, but the present disclosure is not limited hereto. The micro-structures 105m may have recesses 108 with different sizes and/or shapes, but the height of each micro-structure 105m may be the same or different.

By setting specific shapes on the recesses 108 of the micro-structures 105m, the light-emitting elements 103 may have different dimming effects. For example, refer to FIG. 8, FIG. 8 illustrates cross-sectional views of individual micro-structures 105m, according to some embodiments of the present disclosure, while the structures above the diffuser film 105 are omitted. As shown on the leftmost view of FIG. 8, a shape of the recess 108 of the micro-structure 105m may be a triangle, for example, may be isosceles triangle. By embodying the light-emitting element 103 within the recess 108, an angle of output light generated by the light-emitting element 103 may be increased by refraction, to elevate the light uniformity source, or may reduce the number of light-emitting element 103 used in an unit area.

In some embodiments, as shown on the middle and the rightmost views of FIG. 8, cross-sections of the recesses 108 of the micro-structures 105m may be a trapezoid or an arch. By disposing the light-emitting elements 103 within the recesses 108 of the arch or the trapezoid, the angle of output light generated by the light-emitting element 103 may be further reduced, to elevate the dynamic contrast of the display device image.

In the display device described in the present disclosure, there may contain other layers according to actual demand. For example, in some embodiments, there may have other films between the optical functional film 104 and the display panel 102 in the display device. For example, there may be prism lens (or may be referred to brightness enhancement film (BEF) or dual brightness enhancement film (DBEF)) under the display panel 102, to redirect off-axis light and increase on-axis light passing through the display panel 102, and to elevate image brightness viewed by observers.

By introducing a blue light transmittance film as an optical functional film and the diffuser film between the blue light light-emitting element and the wavelength transformation layer, since the light reflected back toward the substrate and the reflective layer may be reduced, and therefore the size of the halo generated by the light-emitting element may be effectively reduced. For example, the diameter of the halo may be reduced by 50%. In some embodiments, the halo size may be measured by lighting one or more light-emitting elements of the aforementioned display device, measuring the brightness of the one or more light-emitting elements. The brightest part of the center is set to 100% brightness, and the radius of the halo is a distance from the 100% brightness point to a 5% brightness point, so the halo size is twice the size of the aforementioned radius.

Although several embodiments and their advantages of the present disclosure have been disclosed above, it should be understood that any of those skilled in the art may make changes, replacements, and retouches without departing from the spirit and scope of the disclosure. Furthermore, the scope of the present disclosure is not intended to be limited by the process, equipment, manufacture, material composition, device, method, and procedure of the specific embodiments described in the specification, any of those skilled in the art may understand from the present disclosure, the present or future process, equipment, manufacture, material composition, device, method, and procedure to be developed, as long as the embodiment described herein may be carried out with approximately similar function or be obtained with approximately similar result, may all be applied according to the present disclosure. Therefore, the scope of the present disclosure includes the aforementioned process, equipment, manufacture, material composition, device, method, and procedure. Additionally, based on the multiple implementation forms mentioned previously, those skilled in the art should be able to understand, the present disclosure has many implementation methods. Every claim may also construct into an individual embodiment, and the scope of the present disclosure also includes various claims and combinations of the embodiments. The scope of the present disclosure should be based on the scope of the claims listed below.

What is claimed is:

1. A display device, comprising:
   a display panel;
   a light-emitting element disposed under the display panel;
   an optical functional film disposed between the display panel and the light-emitting element, wherein the optical functional film is capable of transmitting at least part of light emitted from the light-emitting element; and
   a diffuser film disposed between the display panel and the light-emitting element, wherein a haze of the diffuser film is greater than 85%, and a thickness of the diffuser film ranges from 0.1 mm to 0.3 mm.

2. The display device of claim 1, further comprising a substrate, wherein the light-emitting element is disposed on the substrate.

3. The display device of claim 1, wherein the display panel has a bright region, and the bright region corresponds to the light-emitting element.

4. The display device of claim 1, wherein the diffuser film is disposed between the optical functional film and the light-emitting element.

5. The display device of claim 4, wherein a distance between the diffuser film and the light-emitting element is between 0 mm and 10 mm.

6. The display device of claim 1, wherein the light-emitting element emits blue light, and the optical functional film is a blue light transmittance film.

7. The display device of claim 6, wherein the display device further comprises a wavelength transformation layer, disposed on a side of the blue light transmittance film away from the light-emitting element.

8. The display device of claim 6, wherein a distance between a bottom surface of the blue light transmittance film and the light-emitting element is between 0 mm and 10 mm.

9. The display device of claim 6, further comprising a reflective layer disposed between the light-emitting element and the substrate.

10. The display device of claim 9, wherein a reflective index of the reflective layer ranges from 0.80 to 0.95.

11. The display device of claim 1, wherein the optical functional film is a transflective film.

12. The display device of claim 11, wherein the transflective film is a multi-layer structure.

13. The display device of claim 11, wherein a distance between a bottom surface of the transflective film and the light-emitting element is between 0.1 mm and 10.0 mm.

14. The display device of claim 1, wherein the light-emitting element emits white light, wherein the optical functional film is disposed between the diffuser film and the light-emitting element.

15. The display device of claim 1, wherein a side of the diffuser film close to the light-emitting element has a micro-structure, the micro-structure has a recess facing the light-emitting element.

16. The display device of claim 15, wherein the haze of the diffuser film is different from a haze of the micro-structure.

17. The display device of claim 15, wherein the micro-structure contacts the substrate.

18. The display device of claim 15, further comprises a cavity between the recess and the substrate.

19. The display device of claim 18, wherein the cavity comprises one or more light-emitting elements.

20. The display device of claim 15, wherein a shape of the recess in a cross-section view is a triangle, an arch, or a trapezoid.

* * * * *